United States Patent
Chen

(10) Patent No.: US 10,147,908 B2
(45) Date of Patent: Dec. 4, 2018

(54) REPAIRING METHODS OF ORGANIC LIGHT EMITTING DISPLAY PANELS AND ORGANIC LIGHT EMITTING DISPLAY PANELS

(71) Applicant: Wuhan China Star Optoelectronics Technology Co., Ltd., Wuhan, Hubei (CN)

(72) Inventor: Caiqin Chen, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/552,483

(22) PCT Filed: May 19, 2017

(86) PCT No.: PCT/CN2017/085077
§ 371 (c)(1),
(2) Date: Aug. 21, 2017

(65) Prior Publication Data
US 2018/0294443 A1 Oct. 11, 2018

(30) Foreign Application Priority Data
Apr. 11, 2017 (CN) .......................... 2017 1 0233387

(51) Int. Cl.
*H01L 51/56* (2006.01)
*H01L 27/32* (2006.01)

(52) U.S. Cl.
CPC .......... *H01L 51/56* (2013.01); *H01L 27/3276* (2013.01); *H01L 2251/568* (2013.01)

(58) Field of Classification Search
CPC ................. H01L 51/56; H01L 27/3276; H01L 2251/568
See application file for complete search history.

(56) References Cited

U.S. PATENT DOCUMENTS

2014/0292827 A1* 10/2014 Kang ....................... G09G 3/20
345/690
2016/0351092 A1* 12/2016 Chen .................... G09G 3/3233
2017/0269398 A1* 9/2017 Park ....................... H01L 22/30

* cited by examiner

*Primary Examiner* — Karen Kusumakar
(74) *Attorney, Agent, or Firm* — Andrew C. Cheng

(57) ABSTRACT

The present disclosure relates to a repairing method of organic light emitting display panels and an organic light emitting display panel. The repairing method includes: identifying the display pixels required to be repaired, breaking down a connection between the control end of the transistor on the display pixel required to be repaired and the scanning line, connecting the first route end of the transistor on the display pixel required to be repaired and the second route end, and applying the second reference voltage continuously to the anode of the OLED on the display pixel required to be repair. The OLED may stay in the dark state in response to a configuration of the first reference voltage and the second reference voltage, so as to reduce power-consuming of repairing the organic light emitting display panel and to enhance repairing efficiency.

17 Claims, 4 Drawing Sheets

REPAIRING METHODS OF ORGANIC LIGHT EMITTING DISPLAY PANELS AND ORGANIC LIGHT EMITTING DISPLAY PANELS

BACKGROUND OF THE INVENTION

1. Field of the Invention

The present disclosure relates to display panel field, and more particularly to a repairing method of organic light emitting display panels and an organic light emitting display panel.

2. Discussion of the Related Art

The organic light emitting display panels are active light emitting display panels. Comparing with the conventional thin film transistor (TFT) display panels, the organic light emitting display panels have attributes such as high contrast, wide viewing angle, low power-consuming, and thin. The organic light emitting display panels have potential to follow the TFT display panels and to become the next generation of display panels.

Poor pixels and poor signals are two kinds of unavoidable defects in the organic light emitting display panel manufacturing process. Upon identifying the two kinds of defects mentioned above, it is necessary to repair the organic light emitting display panels before shipping out of the factory.

Conventionally, the method of breaking down the organic light emitting devices of the pixels required to be repaired is adopted to darken the pixels, so as to repair the OLED display panels. However, the energy required to breakdown the organic light emitting devices is too great due to the large space of the pixels within the organic light emitting devices. It takes long time to completely breakdown the organic light emitting devices, and leads to a low repairing efficiency.

SUMMARY

The present disclosure relates to a repairing method of organic light emitting display panels and an organic light emitting display panel capable of reducing the power-consuming of repairing the organic light emitting display panels and capable of improving the repairing efficiency.

In one aspect, the present disclosure relates to a repairing method of an organic light emitting display panel, including: a plurality of display pixels arranged in matrix, wherein each of the display pixels is configured with at least one organic light emitting diode (OLED) having a cathode connecting with a first reference voltage; a driving circuit configured with at least one transistor, wherein a first route end of the transistor connects with power supply wires and connects to a second reference voltage via the power supply wires; a second route end of the transistor connects with an anode of the OLED; a control end of the OLED connects with a scanning line to selectively connect the anode of the OLED with the second reference voltage according to control signals applied on the scanning line; the OLED stays at a dark state in response to a configuration of the first reference voltage and the second reference voltage; and the repairing method includes: identifying unusual light spots on the organic light emitting display panel and determining at least one display pixel corresponding to the unusual light spot as a display pixel required to be repaired; breaking down a connection between the control end of the transistor on the display pixel required to be repaired and the scanning line by conducting a laser cutting process; connecting the first route end of the transistor on the display pixel required to be repaired and the second route end, and applying the second reference voltage continuously to the anode of the OLED on the display pixel required to be repair.

In another aspect, the present disclosure relates to a repairing method of an organic light emitting display panel, including: a plurality of display pixels arranged in matrix, wherein each of the display pixels is configured with at least one OLED having a cathode connecting with a first reference voltage; a driving circuit configured with at least one transistor, wherein a first route end of the transistor connects with power supply wires and connects to a second reference voltage via the power supply wires; a second route end of the transistor connects with an anode of the OLED; a control end of the OLED connects with a scanning line to selectively connect the anode of the OLED with the second reference voltage according to control signals applied on the scanning line; the OLED stays at a dark state in response to a configuration of the first reference voltage and the second reference voltage; and the repairing method includes: identifying the display pixels required to be repaired; breaking down a connection between the control end of the transistor on the display pixel required to be repaired and the scanning line; connecting the first route end of the transistor on the display pixel required to be repaired and the second route end, and applying the second reference voltage continuously to the anode of the OLED on the display pixel required to be repair.

In another aspect, the present disclosure relates to an organic light emitting display panel, including: a plurality of display pixels arranged in matrix, wherein each of the display pixels is configured with at least one organic light emitting diode (OLED) having a cathode connecting with a first reference voltage; a driving circuit configured with at least one transistor, wherein a first route end of the transistor connects with power supply wires and connects to a second reference voltage via the power supply wires; a second route end of the transistor connects with an anode of the OLED; a connection between the control end of the transistor and the scanning line is broken down, and the first route end of the transistor is connected to the second route end to apply the second reference voltage continuously to the anode of the OLED on the display pixel.

In view of the above, the present disclosure breaks down the connection between the control end of the transistor on the display pixel required to be repaired and the scanning line, so as to fail the transistor. Afterward, the present disclosure connects the first route end of the transistor on the display pixel required to be repaired and the second route end and applies the second reference voltage continuously to the anode of the OLED on the display pixel required to be repair. The anode of the OLED connects with the first reference voltage, wherein the OLED may stay in the dark state in response to a configuration of the first reference voltage and the second reference voltage. Therefore, the OLED may stay in the dark state via the repairing method. The repairing method is simple, may reduce power-consuming of repairing the organic light emitting display panel, and may enhance repairing efficiency.

DETAILED DESCRIPTION OF THE EMBODIMENTS

Figure 1:
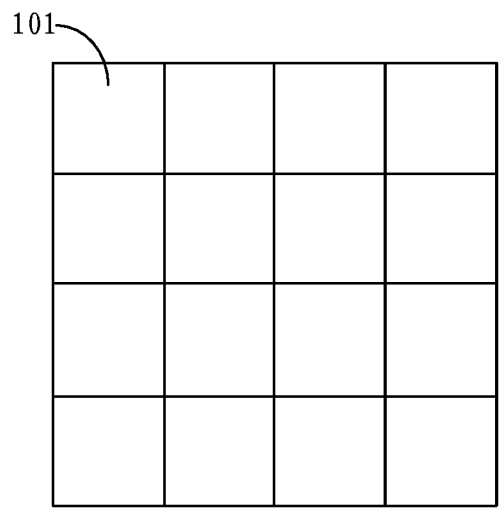
FIG. 1 is a schematic view of an organic light emitting display panel in one embodiment of the present disclosure.
Figure 2:
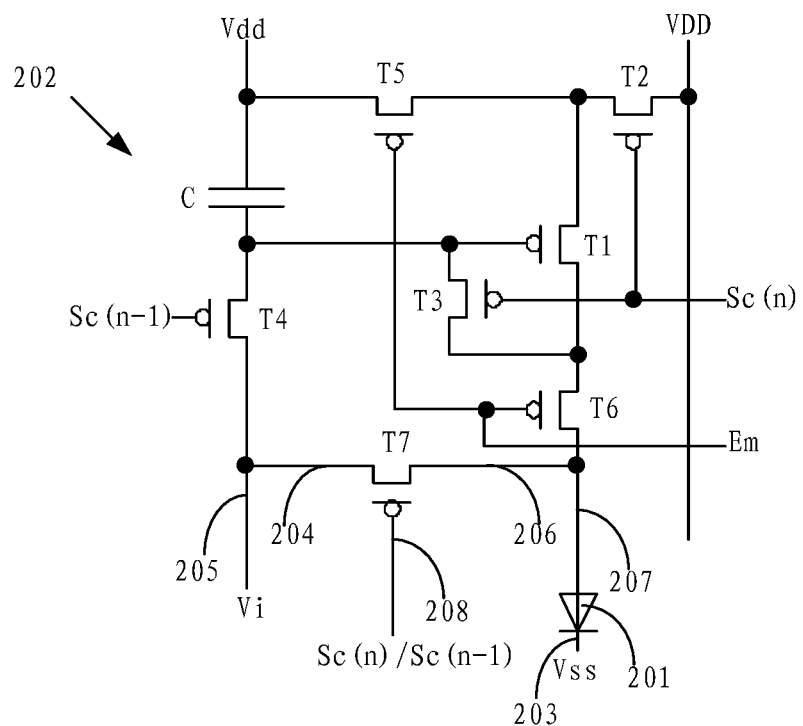
FIG. 2 is a schematic view of a pixel of the embodiment shown in FIG. 1 before being repaired.

The present disclosure related to an organic light emitting display panel, referring to FIG. 1 and FIG. 2, including: a plurality of display pixels 101 arranged in matrix, wherein each of the display pixels 101 is configured with at least one organic light emitting diode (OLED) 201 having a cathode 203 connecting with a first reference voltage Vss, a driving circuit 202 configured with at least one transistor T7, wherein a first route end 204 of the transistor T7 connects with power supply wires 205 and connects to a second reference voltage Vi via the power supply wires 205. A second route end 206 of the transistor T7 connects with an anode 207 of the OLED 201. A control end 208 of the OLED 201 connects with a scanning line to selectively connect the anode 207 of the OLED 201 with the second reference voltage Vi according to control signals applied on the scanning line. The OLED 201 may stay in a dark state in response to a configuration of the first reference voltage Vss and the second reference voltage Vi.

In one example, the second reference voltage Vi may be set to be smaller than a sum of the first reference voltage Vss and a driving voltage of the OLED 201, as such, the OLED 201 may not be driven and may stay in the dark state.

In one example, the driving circuit 202 includes switches T1, T2, T3, T4, T5, T6, and a storage capacitor C, i.e., a 7T1C circuit. The 7T1C circuit may compensate the influence of switching mobility, threshold voltage, driving voltage, and magnitude of the power supply voltage with respect to the display panel on the driving circuit 202. In another example, the driving circuit 202 may adopt other circuit structures, such as a 6T1C circuit. Due to the operating principle of the organic light emitting display panel is not the main point of the present disclosure, it is not described here.

As long as there is one pixel on the organic light emitting display panel is unusual, the performance of image display may be lowered down. Thus, it is necessary to repair the unusual display pixels.

Figure 3:
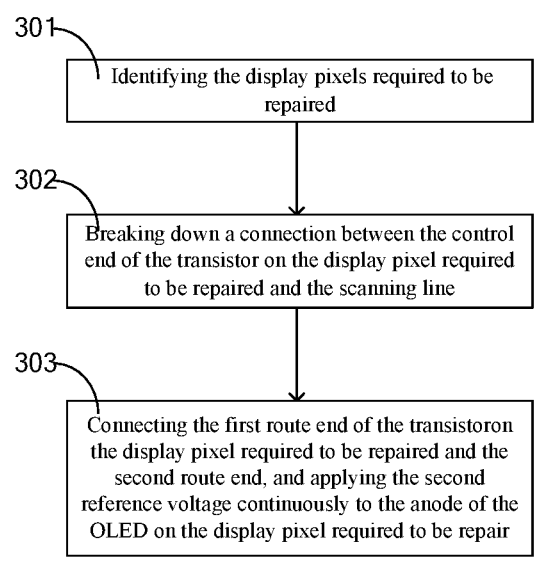
FIG. 3 is a flowchart of a repairing method of the organic light emitting display panels in one embodiment of the present disclosure.

Referring to FIG. 3, FIG. 3 is a flowchart of a repairing method of the organic light emitting display panels in one embodiment of the present disclosure. Base on the embodiment shown in FIG. 2, assuming the display pixel shown in FIG. 2 is the display pixel to be repaired. The repairing method shown in FIG. 3 is adopted to repair the display pixel, and the repairing method includes the following steps.

In Step 301: identifying the display pixels required to be repaired.

In one example, the present disclosure identifies the unusual light spots on the organic light emitting display panel and operates at least one display pixels corresponding to the unusual light spot as a display pixel required to be repaired. In another example, the other criteria may be adopted to identify the display pixel required to be repaired, such as determining the display pixel corresponding to unstable brightness light spot as the display pixel required to be repaired.

In Step 302: breaking down a connection between the control end 208 of the transistor T7 on the display pixel required to be repaired and the scanning line.

In one example, a laser cutting process may be conducted to breakdown the connection between the control end 208 of the transistor T7 on the display pixel required to be repaired and the scanning line. A width of an incision of the laser cutting process is narrow, and thus a heat affecting zone is small, a thermal deformation of the incision is small, and may lead to a high cutting precision. In another example, a Gas thermal cutting process may be adopted to breakdown the connection between the control end 208 of the transistor T7 on the display pixel required to be repaired and the scanning line.

In Step 303: connecting the first route end 204 of the transistor T7 on the display pixel required to be repaired and the second route end 204, and applying the second reference voltage Vi continuously to the anode 207 of the OLED 201 on the display pixel required to be repair.

In one example, a laser welding process is conducted to connect the first route end 204 of the transistor T7 on the display pixel required to be repaired and the second route end 206. Due to the laser welding process has attributes, such as it may reduce the thermal impact (distortion) on the surrounding parts, and it may not cause the vibration of the work piece, the laser welding process is suitable for the welding of the transistor and the other small parts. In another example, an arc welding process may be adopted to connect the first route end 204 of the transistor T7 on the display pixel required to be repaired and the second route end 206.

In view of the above, the present disclosure breaks down the connection between the control end of the transistor on the display pixel required to be repaired and the scanning line, so as to fail the transistor. Afterward, the present disclosure connects the first route end of the transistor on the display pixel required to be repaired and the second route end, and applies the second reference voltage continuously to the anode of the OLED on the display pixel required to be repair. The anode of the OLED connects with the first reference voltage, wherein the OLED may stay in the dark state in response to a configuration of the first reference voltage and the second reference voltage. Therefore, the OLED may stay in the dark state via the repairing method. The repairing method is simple, may reduce power-consuming of repairing the organic light emitting display panel, and may enhance repairing efficiency.

In order to further improve the stability of the second reference voltage Vi continuously to the anode 207 of the OLED 201 on the display pixel required to be repair, a similar method can be used to break down the connection with the anode 207 of the OLED 201 and other lines, such as the transistor T6.

In one example, the transistor T7 is a thin film transistor (TFT). The control end 208 is a gate, the first route end 204 is a source, and the second route end 206 is the drain. In another example, the first route end 204 may be the drain, and the second route end 206 may be the source.

It is noted that a type of the first route end and the second route end are corresponding to the transistor T7. In one example, referring to FIG. 2, the transistor T7 is a P-type TFT, correspondingly, the first route end 204 is the source and the second route end 206 is the drain. When a low level voltage is applied on the gate, the transistor T7 turns on. In another example, the transistor T7 may be a N-type TFT, correspondingly, the first route end 204 is the drain and the second route end 206 is the source. When a high level voltage is applied on the gate, the transistor T7 turns on.

In another example, a metal-oxide-semiconductor (MOS) field effect transistor may be adopted to replace the TFT.

Figure 4:
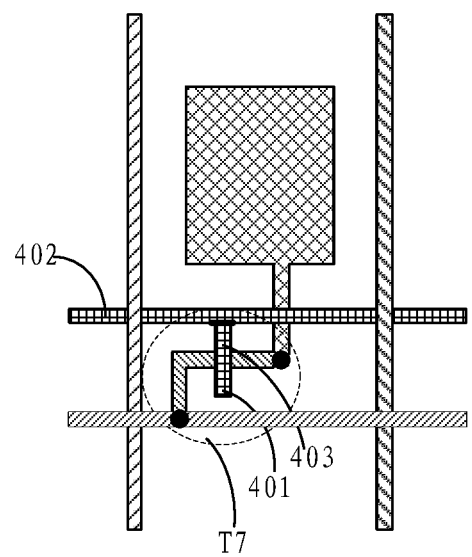
FIG. 4 is a schematic view of a TFT T7 and peripheral circuits of the embodiment shown in FIG. 2

Referring to FIG. 4, the gate 401 of the TFT T7 and the scanning line 402 are arranged on the same layer, and the gate 401 protrudes from the scanning line 402. A protrude portion 403 of the gate 401 with respect to the scanning line 402 is cut off to break down the connection between the TFT T7 and the scanning line, so as to fail the TFT T7. The step of cutting off the gate 401 and the scanning line 402 may be simplified in response to a configuration of the protrude portion 403.

Figure 5:
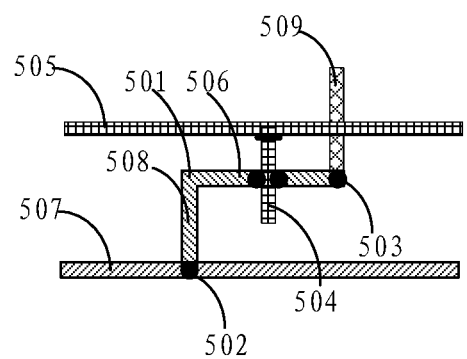
FIG. 5 is a schematic view of the TFT T7 of the embodiment shown in FIG. 4.

Referring to FIG. 5, the present disclosure further includes a semiconductor pattern 501 to migrate carriers between the source 502 and the drain 503. The gate 504 is insulated from and overlapped with the semiconductor pattern 501. The source 502 and the drain 503 electrically connect with the semiconductor pattern configured on two sides of the gate 504 respectively. The gate 504 and a breakdown portion of the scanning line 505 may electrically connect with the semiconductor pattern configured on the two sides of the gate 504 respectively, so as to connect the source 502 of the TFT T7 to the drain 503.

In one example, the semiconductor pattern 501 includes a first pattern area 506. An extending direction of the first pattern area 506 is parallel to an extending direction of the scanning line 505. The gate 504 is perpendicular to the extending direction of the scanning line 505, and the gate 504 protrudes from the scanning line 505 and partially overlaps with the first pattern area 506. The gate 504 may be broken down within an interval area between the first pattern area 506 of the semiconductor pattern 501 and the scanning line 505. In another example, the other portions of the gate 504 may also be cut off from the gate 504.

In one example, an extending direction of power supply wires 507 and the extending direction of the scanning line 505 are parallel with each other. The semiconductor pattern 501 further includes a second pattern area 508. A first end of the first pattern area 506 connects with a first end of the second pattern area 508, wherein the first end of the first pattern area 506 and the first end of the second pattern area 508 are adjacent with each other. A second end of the first pattern area 506 connects with the anode via the drain 503, and a second end of the second pattern area 508 connects with the power supply wires 507 via the source 502. The second end of the first pattern area 506 and the second end of the second pattern area 508 face away from each other.

In one example, the extending direction of the second pattern area 508 is perpendicular to the first pattern are to form the L-shaped semiconductor pattern 501.

In one example, the anode 509 and the power supply wires 507 on the same layer. The gate 504 is configured on a top of the semiconductor pattern 501 in a top-gate form. In another example, a bottom-gate form of the semiconductor pattern may be adopted to replace the top-gate form of the semiconductor pattern.

It is noted that the shape of the semiconductor pattern, the arrangement and the connection between the semiconductor pattern, the gate, the drain, the source, the scanning line, and the anode of the OLED are not limited in the present disclosure.

Figure 6:
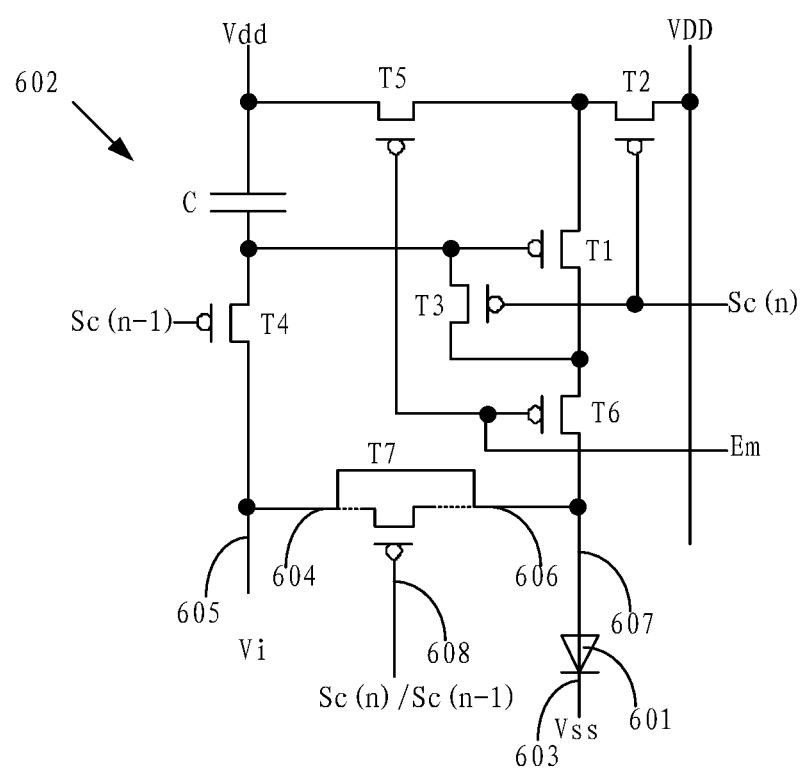
FIG. 6 is a schematic view of a display pixel in one embodiment of the present disclosure.

Referring to FIG. 1 and FIG. 6, the present disclosure further relates to an organic light emitting display panel, including: the display pixels 101 arranged in matrix, wherein each of the display pixels 101 is configured with the OLED 601 having the cathode 603 connecting with the first reference voltage Vss, the driving circuit 602 configured with the transistor T7, wherein the first route end 604 of the transistor T7 connects with the power supply wires 605 and connects to the second reference voltage Vi via the power supply wires 605. The second route end 606 of the transistor T7 connects with the anode 607 of the OLED 601. The connection between the control end 608 of the transistor T7 and the scanning line is broken down, and the first route end 604 of the transistor T7 is connected to the second route end 606 to apply the second reference voltage Vi continuously to the anode 607 of the OLED 601 on the display pixel.

In order to further improve the stability of the second reference voltage Vi continuously to the anode 207 of the OLED 201, break down the connection with the anode 207 of the OLED 201 and other lines, such as the transistor T6.

The display pixel of the present embodiment shown in FIG. 2 has been conducted by the repairing method mentioned above. The specific repairing method and the structure of the driving circuit have been described in detail, and may not be described again here.

In view of the above, the present disclosure breaks down the connection between the control end of the transistor connected to the anode of the OLED on the display pixel and the scanning line. Afterward, the present disclosure connects the first route end of the transistor and the second route end, and applies the second reference voltage continuously to the anode of the OLED. The anode of the OLED connects with the first reference voltage, wherein the OLED may stay in the dark state in response to a configuration of the first reference voltage and the second reference voltage. Therefore, the OLED is able to maintain in the dark state, and may improve the display performance of the organic light emitting display panel.

The above description is only the embodiments in the present disclosure, the claim is not limited to the description thereby. The equivalent structure or changing of the process of the content of the description and the figures, or to implement to other technical field directly or indirectly should be included in the claim.

What is claimed is:
1. A repairing method of an organic light emitting display panel, comprising:
a plurality of display pixels arranged in matrix, wherein each of the display pixels is configured with at least one organic light emitting diode (OLED) having a cathode connecting with a first reference voltage;
a driving circuit configured with at least one transistor, wherein a first route end of the transistor connects with power supply wires and connects to a second reference voltage via the power supply wires;
a second route end of the transistor connects with an anode of the OLED;
a control end of the OLED connects with a scanning line to selectively connect the anode of the OLED with the second reference voltage according to control signals applied on the scanning line;
the OLED stays at a dark state in response to a configuration of the first reference voltage and the second reference voltage; and
the repairing method comprises:
identifying unusual light spots on the organic light emitting display panel and determining at least one display pixel corresponding to the unusual light spot as a display pixel required to be repaired;
breaking down a connection between the control end of the transistor on the display pixel required to be repaired and the scanning line by conducting a laser cutting process;

connecting the first route end of the transistor on the display pixel required to be repaired and the second route end, and applying the second reference voltage continuously to the anode of the OLED on the display pixel required to be repair.

2. The repairing method according to claim 1, wherein the transistor is a thin film transistor (TFT); the control end is a gate of the TFT; the first route end is one of a source and a drain of the TFT and the second route end is the other one of the source and the drain of the TFT;
the gate and the scanning line are arranged on the same layer; the gate protrudes from the scanning line; and
the step of breaking down the connection between the control end of the transistor on the display pixel required to be repaired and the scanning line further comprises:
cutting off a protrusive portion of the gate with respect to the scanning line to break down the connection between the gate and the scanning line.

3. The repairing method according to claim 2, wherein the TFT further comprise a semiconductor pattern insulated from and overlapped with the gate, and the source and the drain electrically connect with the semiconductor pattern configured on two sides of the gate respectively; and
the step of connecting the first route end of the transistor on the display pixel required to be repaired and the second route end further comprises:
electrically connecting the gate and a breakdown portion of the scanning line with the semiconductor pattern configured on the two sides of the gate respectively.

4. The repairing method according to claim 3, wherein the semiconductor pattern comprises a first pattern area; an extending direction of the first pattern area is parallel to an extending direction of the scanning line; the gate is perpendicular to the extending direction of the scanning line, and the gate protrudes from the scanning line and partially overlaps with the first pattern area; and
the step of cutting off the protrusive portion of the gate with respect to the scanning line to break down the connection between the gate and the scanning line further comprises:
breaking down the gate within an interval area between the first pattern area of the semiconductor pattern and the scanning line.

5. The repairing method according to claim 4, wherein an extending direction of power supply wires and the extending direction of the scanning line are parallel with each other;
the semiconductor pattern further comprises a second pattern area, and a first end of the first pattern area connects with a first end of the second pattern area, wherein the first end of the first pattern area and the first end of the second pattern area are adjacent with each other; a second end of the first pattern area connects with the anode via the drain, and a second end of the second pattern area connects with the power supply wires via the source;
the second end of the first pattern area and the second end of the second pattern area face away from each other.

6. The repairing method according to claim 5, wherein the extending direction of the second pattern area is perpendicular to the first pattern area to form the L-shaped semiconductor pattern.

7. The repairing method according to claim 3, wherein the anode and the power supply wires are on the same layer, and the gate is configured on a top of the semiconductor pattern in a top-gate form.

8. A repairing method of an organic light emitting display panel, comprising:
a plurality of display pixels arranged in matrix, wherein each of the display pixels is configured with at least one OLED having a cathode connecting with a first reference voltage;
a driving circuit configured with at least one transistor, wherein a first route end of the transistor connects with power supply wires and connects to a second reference voltage via the power supply wires;
a second route end of the transistor connects with an anode of the OLED;
a control end of the OLED connects with a scanning line to selectively connect the anode of the OLED with the second reference voltage according to control signals applied on the scanning line;
the OLED stays at a dark state in response to a configuration of the first reference voltage and the second reference voltage; and
the repairing method comprises:
identifying the display pixels required to be repaired;
breaking down a connection between the control end of the transistor on the display pixel required to be repaired and the scanning line;
connecting the first route end of the transistor on the display pixel required to be repaired and the second route end, and applying the second reference voltage continuously to the anode of the OLED on the display pixel required to be repair.

9. The repairing method according to claim 8, wherein the step of identifying the display pixels required to be repaired further comprises:
identifying unusual light spots on the organic light emitting display panel;
determining at least one display pixel corresponding to the unusual light spot as a display pixel required to be repaired.

10. The repairing method according to claim 8, wherein the step of breaking down the connection between the control end of the transistor on the display pixel required to be repaired and the scanning line further comprises:
cutting off a connection between the control end of the transistor on the display pixel required to be repaired and the scanning line by conducting a laser cutting process; and
the step of connecting the first route end of the transistor on the display pixel required to be repaired and the second route end, and applying the second reference voltage continuously to the anode of the OLED on the display pixel required to be repair further comprises:
connecting the first route end of the transistor on the display pixel required to be repaired and the second route end by conducting a laser welding process.

11. The repairing method according to claim 8, wherein the transistor is a TFT; the control end is a gate of the TFT; the first route end is one of a source and a drain of the TFT and the second route end is the other one of the source and the drain of the TFT; the gate and the scanning line are arranged on the same layer; the gate protrudes from the scanning line;
and the step of breaking down the connection between the control end of the transistor on the display pixel required to be repaired and the scanning line further comprises:
cutting off a protrude portion of the gate with respect to the scanning line to break down the connection of the gate and the scanning line.

12. The repairing method according to claim 11, wherein the TFT further comprise a semiconductor pattern insulated from and overlapped with the gate, and the source and the drain electrically connect with the semiconductor pattern configured on two sides of the gate respectively; and the step of connecting the first route end of the transistor on the display pixel required to be repaired and the second route end, and applying the second reference voltage continuously to the anode of the OLED on the display pixel required to be repair further comprises:

electrically connecting the gate and a breakdown portion of the scanning line with the semiconductor pattern configured on the two sides of the gate respectively.

13. The repairing method according to claim 12, wherein the semiconductor pattern comprises a first pattern area; an extending direction of the first pattern area is parallel to an extending direction of the scanning line; the gate is perpendicular to the extending direction of the scanning line, and the gate protrudes from the scanning line and partially overlaps with the first pattern area; and the step of cutting off the protrude portion of the gate with respect to the scanning line to break down the scanning line further comprises:

cutting off the gate within an interval area between the first pattern area of the semiconductor pattern and the scanning line.

14. The repairing method according to claim 13, wherein an extending direction of power supply wires and the extending direction of the scanning line are parallel with each other;

the semiconductor pattern further comprises a second pattern area, and a first end of the first pattern area connects with a first end of the second pattern area, wherein the first end of the first pattern area and the first end of the second pattern area are adjacent with each other;

a second end of the first pattern area connects with the anode via the drain, and a second end of the second pattern area connects with the power supply wires via the source;

the second end of the first pattern area and the second end of the second pattern area face away from each other.

15. The repairing method according to claim 14, wherein the extending direction of the second pattern area is perpendicular to the first pattern area to form the L-shaped semiconductor pattern.

16. The repairing method according to claim 12, wherein the anode and the power supply wires are on the same layer, and the gate is configured on a top of the semiconductor pattern in a top-gate form.

17. An organic light emitting display panel, comprising:

a plurality of display pixels arranged in matrix, wherein each of the display pixels is configured with at least one organic light emitting diode (OLED) having a cathode connecting with a first reference voltage;

a driving circuit configured with at least one transistor, wherein a first route end of the transistor connects with power supply wires and connects to a second reference voltage via the power supply wires;

a second route end of the transistor connects with an anode of the OLED;

a connection between the control end of the transistor and the scanning line is broken down, and the first route end of the transistor is connected to the second route end to apply the second reference voltage continuously to the anode of the OLED on the display pixel.

* * * * *